US011747127B2

(12) United States Patent
Rickless et al.

(10) Patent No.: US 11,747,127 B2
(45) Date of Patent: Sep. 5, 2023

(54) TOOL FOR PRECISE LOCATING OF FASTENERS UNDER COATINGS

(71) Applicant: The Boeing Company, Chicago, IL (US)

(72) Inventors: Keenan S. Rickless, Layton, UT (US); Gary E. Georgeson, Tacoma, WA (US)

(73) Assignee: The Boeing Company, Arlington, VA (US)

( * ) Notice: Subject to any disclaimer, the term of this patent is extended or adjusted under 35 U.S.C. 154(b) by 0 days.

(21) Appl. No.: 17/468,725

(22) Filed: Sep. 8, 2021

(65) Prior Publication Data

US 2022/0136815 A1 May 5, 2022

Related U.S. Application Data

(60) Provisional application No. 63/108,846, filed on Nov. 2, 2020.

(51) Int. Cl.
*G01B 5/25* (2006.01)
*B25J 11/00* (2006.01)
(Continued)

(52) U.S. Cl.
CPC ............ *G01B 5/14* (2013.01); *B25J 11/005* (2013.01); *B25J 19/027* (2013.01); *G01B 5/25* (2013.01);
(Continued)

(58) Field of Classification Search
CPC . Y10T 29/49771; B25J 11/055; B25J 19/027; B25J 11/0055; G01B 5/25; G01B 5/28; G01R 1/06705
See application file for complete search history.

(56) References Cited

U.S. PATENT DOCUMENTS 5,399,968 A * 3/1995 Sheppard ............. G01N 27/904
324/262
7,301,335 B2 * 11/2007 Sun ........................ G01N 27/82
324/242
(Continued)

FOREIGN PATENT DOCUMENTS

CA 2772848 A1 * 9/2012 ............. G01S 13/88
EP 3683576 A1 * 7/2020 ............ B25J 15/0019
GB 2491978 A * 12/2012 ............. B64F 5/0045

*Primary Examiner* — Jermie E Cozart
(74) *Attorney, Agent, or Firm* — Ostrager Chong Flaherty & Broitman P.C.

(57) ABSTRACT

A fastener locating tool equipped with a sensor head having one or more probes and a method for operating such a tool for precisely locating a fastener that is hidden or buried under a thick coating applied on a surface of a structure. The fastener locating tool may be manually or automatically operated. The fastener locating tool includes a platform having a central opening, means for temporarily attaching the platform to a coated surface, and a sensor head that may be easily mechanically coupled to and then later decoupled from the platform. Optionally, the fastener locating tool also includes a multi-stage positioning system with X and Y stages which may be used to adjust the position of the sensor head. The sensor head includes at least one probe which generates electrical signals indicating the presence of a fastener beneath a coating when the probe is within a detection range.

21 Claims, 15 Drawing Sheets

(51) Int. Cl.
   G01B 5/28   (2006.01)
   B25J 19/02  (2006.01)
   G01B 5/14   (2006.01)
   *G01R 1/067*    (2006.01)

(52) U.S. Cl.
   CPC ............. G01B 5/28 (2013.01); *B25J 11/0055* (2013.01); *G01R 1/06705* (2013.01); *Y10T 29/49771* (2015.01)

(56) References Cited

U.S. PATENT DOCUMENTS

| | | |
|---|---|---|
| 9,069,028 B2 | 6/2015 | Ebner et al. |
| 9,134,447 B1 | 9/2015 | Tin et al. |
| 9,221,506 B1 * | 12/2015 | Georgeson ............... B05D 7/00 |
| 9,937,565 B2 | 4/2018 | Hu et al. |
| 10,168,287 B2 | 1/2019 | Georgeson et al. |
| 10,197,639 B1 | 2/2019 | Blake |
| 2011/0267050 A1 | 11/2011 | Flores |
| 2016/0363543 A1 * | 12/2016 | Georgeson ............. G01N 22/02 |
| 2019/0145909 A1 * | 5/2019 | Georgeson ............. G01N 22/02 342/22 |

* cited by examiner

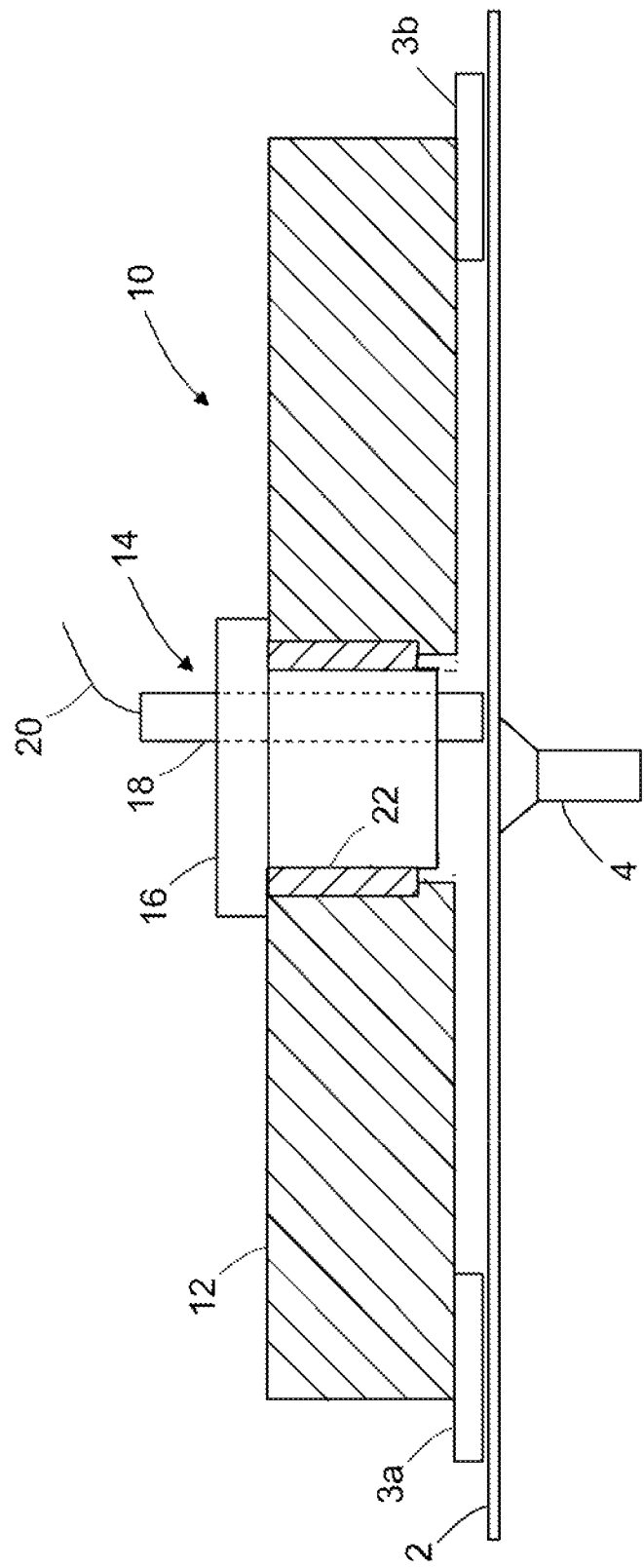

TOOL FOR PRECISE LOCATING OF FASTENERS UNDER COATINGS

RELATED PATENT APPLICATION

This application claims the benefit, under Title 35, United States Code, Section 119(e), of U.S. Provisional Application No. 63/108,846 filed on Nov. 2, 2020.

BACKGROUND

This disclosure generally relates to apparatus and methods for finding and locating a metal object hidden under a thick surface coating. In particular, this disclosure relates to locating a fastener under a thick coating applied on the skin of an aircraft.

Access to fasteners under low observable, anti-erosion, and other special coatings is often required during maintenance of an aircraft. Aircraft coatings have a tendency to obscure the heads of fasteners. Current methods for locating hidden fasteners include a so-called "poke test" which requires a maintainer to poke at a thick coating in the approximate area of the expected location of a fastener head. Coatings overlying the fastener head are slightly thicker and therefore depress slightly more than neighboring coatings when poked. This phenomenon is subtle and occasionally leads a maintainer to remove coating in the wrong area and possibly adversely impact underlying structure while "searching". Incorrectly locating a fastener head may result in significant costs and airplane-on-ground delays. Another method for locating hidden fasteners involves heating an area with a heat gun and imaging the heated area with an infrared imaging system. Fasteners hold heat better than skin, so the fasteners become clearer on the visual infrared readout. This infrared detection method requires expensive equipment, time, and training.

Maintenance activities that require the removal of fasteners need to have a reliable, accurate, and repeatable method to find and locate fasteners without adversely impacting underlying structure.

SUMMARY

The subject matter disclosed in detail below is directed to a fastener locating tool equipped with a sensor head having one or more probes and a method for operating such a tool for precisely locating a fastener that is hidden or buried under a thick coating applied on a surface of a structure. The fastener locating tool may be manually or automatically operated. In an aerospace application, the tool is suitable for use in finding and locating fasteners hidden or buried under a thick coating applied on the skin of an aircraft, such as low observable, anti-erosion, or other thick coatings that make it difficult to locate fasteners with traditional sensing methods. The fastener locating tool prevents costly and time-consuming re-work or repair of coatings due to imprecise or incorrect locating of fasteners during maintenance activities.

As used herein, the term "locating a fastener" means determining a location of the center of the fastener. As used here, the terms "position" and "location", as applied to the fastener, are used synonymously. This convention is adopted herein because the orientation of the fastener is not of interest to persons performing the maintenance operations disclosed herein.

In accordance with the manually operated embodiments, the fastener locating tool includes a platform having a central opening, means for temporarily attaching the platform to a coated surface, and a sensor head that may be easily mechanically coupled to and then later decoupled from the platform. Optionally, the fastener locating tool also includes a multi-stage positioning system with X and Y stages which may be moved to make small, finer adjustments in the positioning of the sensor head after the initial positioning of the fastener locating tool.

In both manually operated and automatic embodiments, the sensor head includes at least one probe which is configured to generate electrical signals which indicate the presence of a fastener beneath a coating when the probe is within a detection range of the fastener. Each probe of the sensor head is configured to transduce the degree of interaction with a fastener into an electrical signal. Each probe is communicatively coupled to transmit electrical signals (hereinafter "sensor data signals") to a signal processing device. The signal processing device is configured to output a signal indicating that the sensor head is aligned with the sought fastener when the sensor data has values indicating such alignment.

In accordance with the manually operated embodiments, upon detecting that the sensor head is aligned with the fastener, the fastener locating tool may be held stationary via vacuum, electro-statics, tape, temporary adhesive, or even manually, etc. and a further operation (e.g., marking the fastener center on the coated surface or cutting the coating) may be performed.

In accordance with one proposed implementation, the sensor head includes a base which is rotatable relative to the platform and a single probe which is affixed to the rotatable base at a position offset from the axis of rotation. The rotation of the sensor head that produces the circular path for the probe can be driven by hand or through the use of a small motor. The general center of the fastener is found by sensing its edge, and then moving the probe to different X-Y positions by trial and error until the probe signal indicates that the location of the fastener has been found. More specifically, if the probe signal is flat (relatively constant) as the probe revolves along the perimeter of the fastener head, this flat signal indicates that the axis of rotation of the rotatable base is aligned (or nearly aligned within a specified tolerance) with the central axis of the fastener. Variations in the signal indicate the axis of rotation of the rotatable base is not aligned with the center axis of the fastener.

In accordance with an alternative proposed implementation, the sensor head includes multiple probes (e.g., two to four probes) arranged offset from the center of and at equiangular intervals on a stationary (non-rotating) base. Each probe outputs a respective signal which is characterized by that probe's particular position relative to the fastener edge. In this case, the probes need not revolve since similar information is provided by multiple stationary probes as compared to a single rotating probe.

In accordance with manually operated embodiments, after a fastener has been located, a cutting device may be substituted for the sensor head in order to remove the coating overlying the located fastener. Alternatively, the fastener locating tool incorporates a marking device for marking the coating to indicate the fastener location. In this case, the entire fastener locating tool (with marking device) would be removed before cutting using a different tool.

In accordance with various automated embodiments, the fastener locating tool could be mounted to the end effector of a robotic arm (a.k.a. multi-linked manipulator) or to the frame of a crawler vehicle (a.k.a. crawling robot) (collectively referred to hereinafter as "robots"). The robot may operate automatically under the control of a system controller which is configured to execute a search routine. This fully automated method is capable of quickly and precisely locating an entire pattern of fasteners that could be addressed immediately one at a time or marked for later coating removal.

Although various embodiments of tools and methods for precisely locating a fastener under a coating are described in some detail later herein, one or more of those embodiments may be characterized by one or more of the following aspects.

One aspect of the subject matter disclosed in detail below is a method for locating a fastener under a coating, the method comprising: attaching a probe to a sensor head such that the probe is offset from an axis of rotation of the sensor head; moving the sensor head to successive sensor head positions overlying the coating; rotating the sensor head about the axis of rotation at each successive sensor head position, thereby causing the probe to revolve along a circular path; during each revolution, using the probe to generate sensor data signals which vary in dependence on a position of the probe relative to the fastener; and locating the fastener when variation in the sensor data signals is less than a specified threshold. In one proposed implementation, a diameter of the circular path of the probe during a revolution is equal to an outer diameter of a head of the fastener.

Another aspect of the subject matter disclosed in detail below is a method for locating a fastener under a coating, the method comprising: attaching at least three probes to a sensor head such that respective centers of the probes are offset from a center of the sensor head by equal distances at respective angular positions in a frame of reference of the sensor head; moving the sensor head to successive sensor head positions overlying the coating; at each successive sensor head position, using the probes to generate respective sensor data signals which vary in dependence on a position of the respective probe relative to the fastener; and locating the fastener when the respective sensor data signals generated by the probes are in balance. In one proposed implementation, the centers of the probes lie along a pitch circle having a diameter equal to a diameter of a head of the fastener.

In accordance with some embodiments, each method may further comprise marking the coating at a position overlying the fastener that was located. In accordance with some embodiments, each method may further comprise: removing the sensor head from the platform; mounting a cutting device to the platform in place of the sensor head; using the cutting device to cut a portion of the coating; and removing the cut portion of the coating to expose the fastener.

A further aspect of the subject matter disclosed in detail below is a tool for locating a fastener under a coating, the tool comprising: a sensor head support structure having a circular opening; a plurality of attachment devices mounted to the sensor head support structure and configured to adhere to a coating on a surface; and a sensor head comprising a base disposed in the circular opening and at least one probe that is offset from a center of the base and configured to detect a fastener under the coating when the attachment devices are adhered to the coating.

Yet another aspect of the subject matter disclosed in detail below is an automated system for locating a fastener under a coating, the system comprising: a robot; a platform mounted to the robot and having a circular opening; and a sensor head comprising a base disposed in the circular opening and at least one probe that is offset from a center of the base and configured to detect a fastener under the coating when the probe is within a detection range of the fastener. In some embodiments, the automated system further comprises a motor coupled to drive rotation of the sensor head about an axis of rotation at the center of the base.

Other aspects of tools and methods for precisely locating a fastener under a coating are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams are drawn to scale.

FIG. 1 is a diagram representing a partially sectional view of a portion of a fastener locating tool having a rotatable sensor head in accordance with one embodiment.

Reference will hereinafter be made to the drawings in which similar elements in different drawings bear the same reference numerals.

DETAILED DESCRIPTION

Figure 2A:
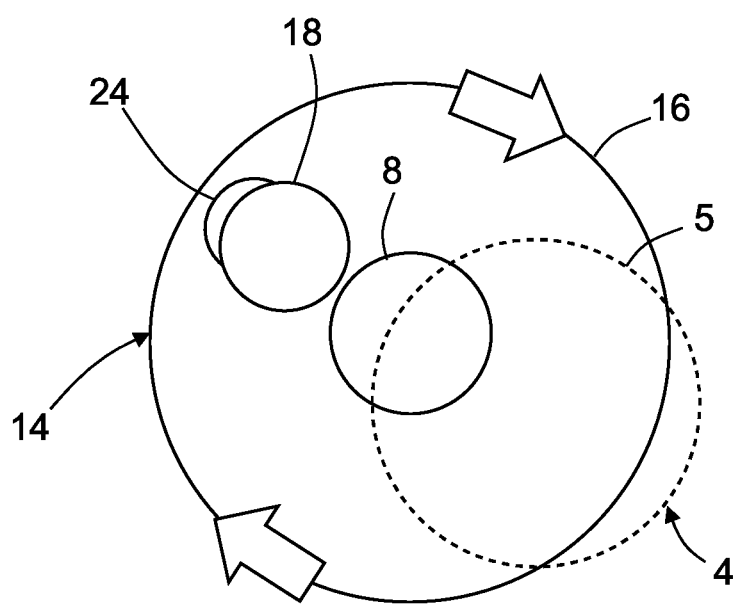
FIG. 2A is a diagram showing a top view of a rotating sensor head partially overlying and not nearly aligned with a hidden fastener. The sensor head includes a probe that is offset from the axis of rotation.

For the purpose of illustration, tools and methods for precisely locating a fastener under a coating will now be described in detail. However, not all features of an actual implementation are described in this specification. A person skilled in the art will appreciate that in the development of any such embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1 is a diagram representing a partially sectional view of a portion of a fastener locating tool 10 in accordance with one embodiment. The fastener locating tool 10 comprises a platform 12 having a central opening 13 and a sensor head 14 which is rotatably coupled to the platform 12 by a bushing 22. The bushing 22 is seated in the central opening 13 formed in platform 12. In the scenario depicted in FIG. 1, the sensor head 14 overlies a fastener 4 which is covered by a coating 2 on a surface.

The fastener locating tool 10 depicted in FIG. 1 further includes a plurality (in this example, one pair) of attachment devices 3a and 3b mounted to the bottom of platform 12. The attachment devices 3a and 3b are configured to temporarily adhere the platform 12 to the coating 2. The attachment devices 3a and 3b may be vacuum adherence devices (e.g., suction cups) or electroadhesion devices. Alternatively, the attachment devices 3a and 3b may be omitted, in which case the platform 12 may be attached to the coating 2 using tape or temporary adhesive or held in contact with the coating 2 manually by a technician.

The sensor head 14 comprises a base 16 having a circular cylindrical body portion which is disposed in and rotatable relative to the bushing 22. Thus, the sensor head is rotatable relative to the platform 12. The sensor head 14 is also easily mechanically coupled to and then later decoupled from the platform 12 by inserting the circular cylindrical body portion of base 16 inside the circular cylindrical bore of bushing 22.

The sensor head 14 further includes a probe 18 that is offset from a center of the base 16. The probe 18 includes a send-receive sensor which is capable of detecting a fastener made of a material having a conductivity or impedance that differs from the conductivity or impedance of the structural material in which the fastener is embedded. The send-receive sensor may be an eddy current sensor, an ultrasonic transducer, or a terahertz sensor, with the selection of the sensor type being dependent upon the coating and fastener materials and coating thickness.

In accordance with the embodiment depicted in FIG. 1, the probe 18 is configured to detect the fastener 4 under the coating 2 when the attachment devices 3a and 3b are adhered to the coating 2. The probe 18 revolves along a circular path as the sensor head 14 rotates inside bushing 22. Rotation of sensor head 14 may be driven manually or by a motor. In the latter case, the output shaft of the motor (not shown in FIG. 1) may be operatively to the base 16 by means of a ring gear attached to the base 16 and a pinion gear attached to the output shaft of the motor, with teeth of the pinion gear being engaged with teeth of the ring gear. In accordance with one proposed implementation, a diameter of the circular path of the probe 18 during a revolution is equal to an outer diameter of the head of the fastener 4. Thus, when the axis of rotation of the base 16 is coaxial (collinear) with the center axis of the fastener 4, the center of the probe 18 overlies the outer perimeter of the head 7 of fastener 4, as is depicted in FIG. 1.

The probe 18 is configured to generate electrical signals which indicate the presence of the fastener 4 beneath the coating 2 when the sensor head 14 is placed within a detection range. More specifically, the probe 18 is configured to transduce the degree of interaction with fastener 4 into electrical signals representing sensor data. The probe 18 is communicatively coupled to a signal processing device (not shown in FIG. 1, but see signal processor 40 in FIG. 10) via a cable 20. The probe 18 transmits sensor data to the signal processor 40 via cable 20 and also receives activation signals from the signal processor 40 for activating the transmitter of the send-receive sensor.

The fastener locating tool 10 may be used to find and locate the fastener 4. FIG. 1 depicts a situation in which the fastener has been located in the sense that the electrical signals output by the probe 18 indicate that the central axis of fastener 4 and the central axis (axis of rotation) of sensor head 14 are coaxial (aligned). During the finding and locating process, the platform 12 is moved to successive platform positions overlying the coating 2 and then the probe 18 is activated in a trial-and-error manner. (Inherently, the sensor head 14 is moved to successive platform positions at the same times.) At each successive sensor head position, sensor head 14 is rotated about the axis of rotation, thereby causing the probe 18 to revolve along a circular path. During each revolution, the probe 18 generates sensor data signals which vary in dependence on the position of probe 18 relative to the fastener 4. The fastener 4 is located when the variation in the sensor data signals is less than a specified threshold.

Figure 3A:
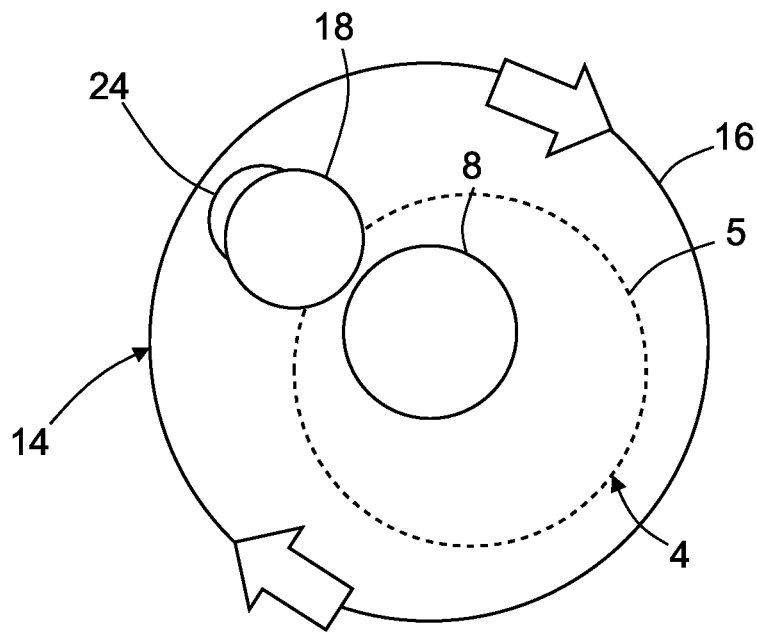
FIG. 3A is a diagram showing a top view of the rotating sensor head overlying and nearly aligned with the hidden fastener.
Figure 4A:
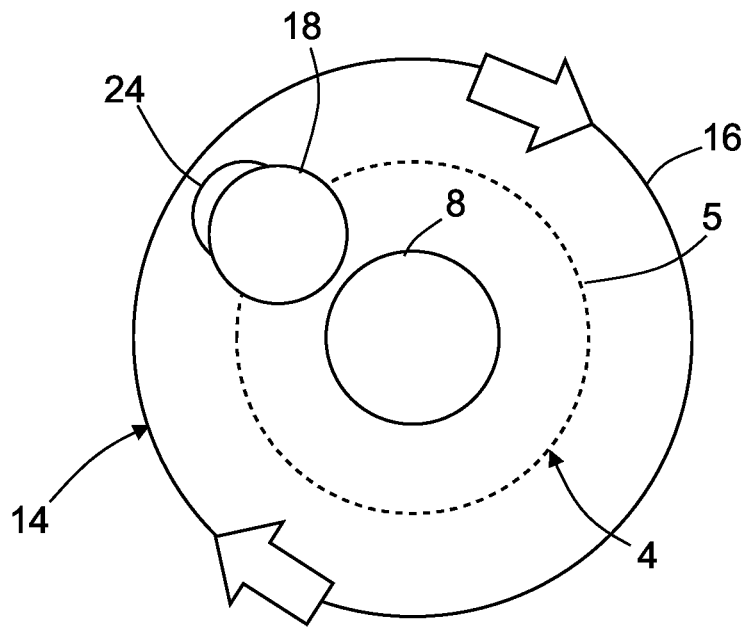
FIG. 4A is a diagram showing a top view of the rotating sensor head overlying and aligned with the hidden fastener.

FIGS. 2A, 3A, and 4A are diagrams showing respective top views of a rotating sensor head 14 at three different sensor head positions relative to the fastener 4. The dashed circle indicates the circular outer perimeter of the fastener head 5. The sensor head includes a plunger 8 at its center and a probe 18 which is offset from the center of the sensor head 14. The arrows indicate the direction in which the sensor head 14 is rotating. As the sensor head rotates, the probe 18 revolves along a circular path not shown in FIGS. 2A, 3A, and 4A.

The offset position of the center of probe 18 is adjustable along a radial line that extends from the center (axis of rotation) of the sensor head 14. This adjustability is enabled by providing a radial probe adjustment slot 24 and a locking mechanism for locking probe 18 at a particular position along the length of radial probe adjustment slot 24. During set-up, the radial position of the center of the probe 18 is adjusted so that when the base 16 is rotated, the circular path traveled by the probe 18 as the sensor head 14 rotates will have a diameter that has a specified relationship to the outer diameter of the fastener head 5. For example, the probe radial position may be selected such that the diameter of the circular path traveled by the probe center during each revolution is equal to the outer diameter of the fastener head 5. However, it should be appreciated that the inventive concept disclosed herein is not dependent on the diameter of probe revolution being precisely equal to the outer diameter of the fastener head 5. The diameter of the circular path may be adjusted to optimize the sensor sensitivity to the edge (outer perimeter) of the fastener head and signal-to-noise levels on a reference standard representing the coating, fastener, and skin materials, as well as the coating thickness. (The best path diameter setting will be near the steepest part of the drop-off of the signal while receiving a sufficiently strong signal from the fastener 4.)

The rotation of the sensor head 14 that produces the circular path for the probe 18 can be driven by hand or through the use of a small motor. The general center of the fastener 4 is found by sensing its edge, and then moving the probe 18 to different X-Y positions by trial and error until the probe signal indicates that the location of the fastener has been found.

Figure 2B:
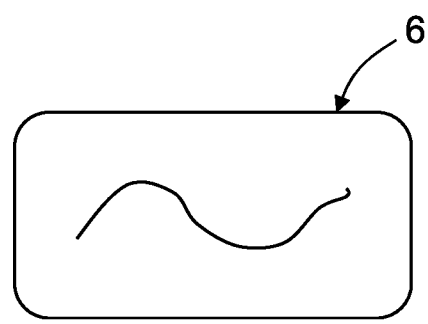
FIG. 2B is a diagram representing the display of a graph representing a varying electrical signal produced over time by the probe depicted in FIG. 2A during a complete revolution.

FIG. 2B is a diagram representing the display on an oscilloscope 6 of a graph representing a varying electrical signal produced over time by the probe 18 while positioned relative to the fastener 4 as depicted in FIG. 2A during a complete revolution. In this scan position, the sensor head 14 partially overlies and is not nearly aligned with the fastener 4. The magnitude of the electrical signal output by probe 18 has a large variation because the misalignment between the centers of the sensor head 14 and fastener 4 is relatively large.

Figure 3B:
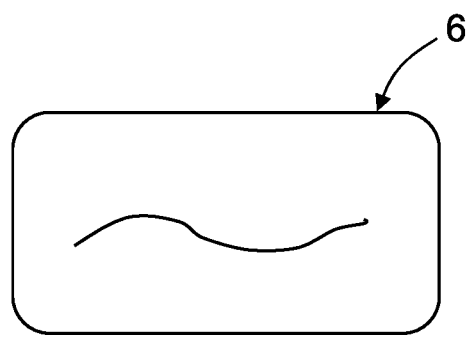
FIG. 3B is a diagram representing the display of a graph representing a less varying electrical signal produced over time by the probe depicted in FIG. 3A during a complete revolution.

FIG. 3B is a diagram representing the display on oscilloscope 6 of a graph representing a varying electrical signal produced over time by the probe 18 while positioned relative to the fastener 4 as depicted in FIG. 3A during a complete revolution. In this scan position, the sensor head 14 overlies and is nearly aligned with the fastener 4. The magnitude of the electrical signal output by probe 18 has a small variation because the misalignment between the centers of sensor head 14 and fastener 4 is less than the misalignment depicted in FIG. 2A.

Figure 4B:
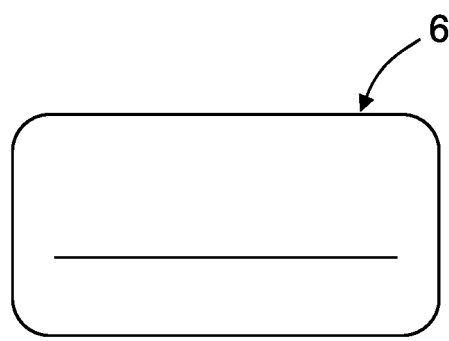
FIG. 4B is a diagram representing the display of a graph representing a flat or constant electrical signal produced over time by the probe depicted in FIG. 4A during a complete revolution.

FIG. 4B is a diagram representing the display on oscilloscope 6 of a graph representing a constant or nearly constant electrical signal produced over time by the probe 18 while positioned relative to the fastener 4 as depicted in FIG. 4A during a complete revolution. In this scan position, the sensor head 14 overlies and is aligned with the fastener 4. The magnitude of the electrical signal output by probe 18 is flat (has no variation) because the centers of sensor head 14 and fastener 4 are now aligned.

Figure 10:
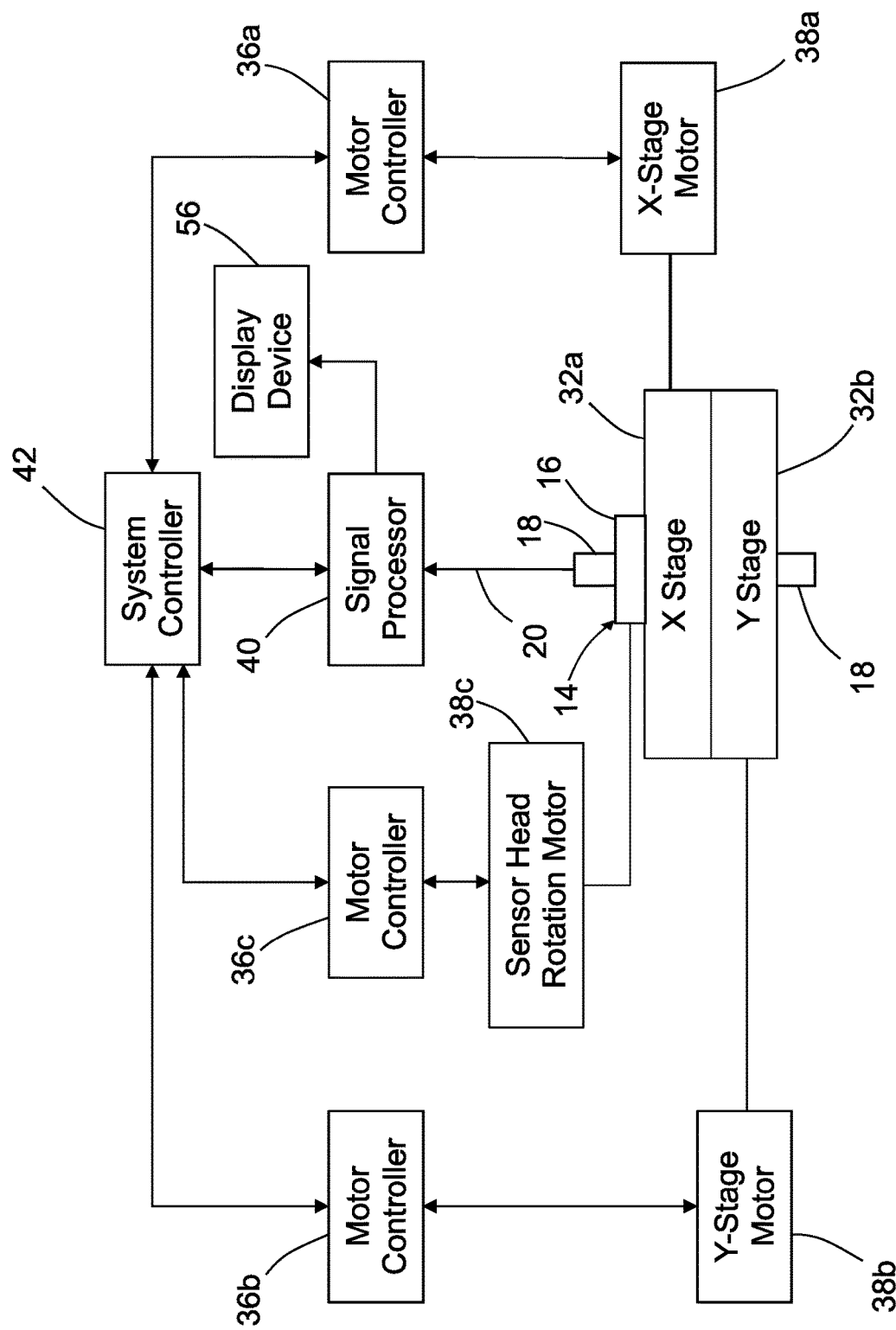
FIG. 10 is a block diagram identifying components of a fastener locating tool that includes an automated multi-stage positioning system in accordance with a further embodiment.

The detection of the flat electrical signal by the signal processor alerts the system controller to the fact that the fastener 4 has been located (see signal processor 40 and system controller 42 in FIG. 10). More specifically, if the probe signal is flat (relatively constant) as the probe 18 revolves along the perimeter of the fastener head 5, this flat signal indicates that the axis of rotation of the base 16 is aligned (or nearly aligned within a specified tolerance) with the central axis of the fastener 4. Variations in the signal indicate the axis of rotation of the base 16 is not aligned with the center axis of fastener 4.

The sensor head 14 may be moved intermittently over the skin of an aircraft fuselage to successive sensor head positions in the vicinity of a fastener to be located. At each successive sensor head position, the sensor head 14 is rotated at least 360 degrees, which causes the probe 18 to revolve one complete revolution. The fastener location is found (determined) when the probe output signal is flat during a complete revolution of the probe at a particular sensor head position (tool location).

The fastener locating tool 10 optionally has X and Y stages which may be moved to make small, finer adjustments after the initial positioning of the tool by hand. (A multi-stage positioning system is described later with reference to FIGS. 9B, 9C and 10.) Fine scanning of the probe in an X-Y plane can be accomplished manually or automatically in accordance with alternative embodiments. Fine adjustments using the X and Y stages gets to a very precise location where the probe axis (center) follows along the perimeter of the fastener head 5.

In accordance with an alternative embodiment, the sensor head includes multiple probes (e.g., two to four probes) arranged offset from the center of and at equiangular intervals on a stationary (non-rotating) base. Each probe outputs a respective signal which is characterized by that probe's particular position relative to the fastener edge. Each probe senses the edge of the fastener head. The multiple probe outputs will be balanced when the center of the pitch circle is aligned with the center of the fastener head. In this case, the probes need not revolve since similar information is provided by multiple stationary probes as compared to a single rotating probe. Once the general location of the fastener is found, the tool is adhered to the coated surface using vacuum adherence or electroadhesion devices, tape, or temporary adhesive, thereby maintaining the platform stationary during a subsequent operation (e.g., cutting the portion of coating overlying the located fastener).

Figure 5A:
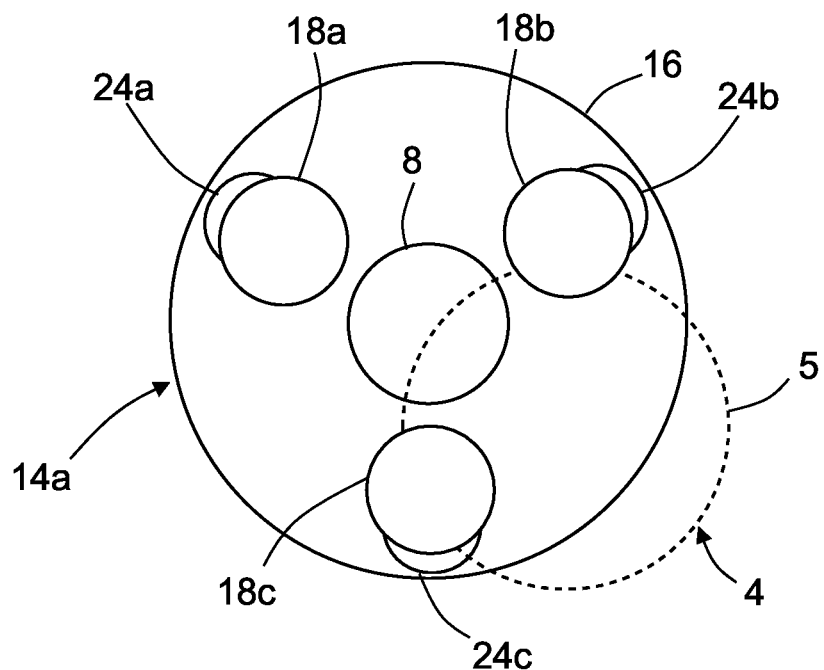
FIG. 5A is a diagram showing a top view of a multi-probe sensor head partially overlying and not nearly aligned with a hidden fastener. The sensor head includes three probes that are offset at equiangular intervals from the center axis of the sensor head.
Figure 6A:
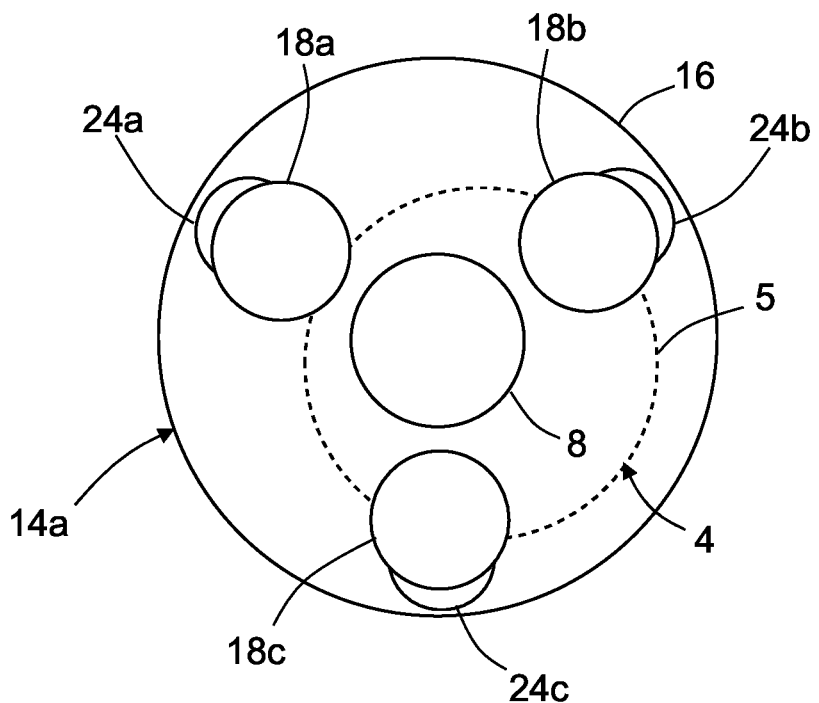
FIG. 6A is a diagram showing a top view of the multi-probe sensor head overlying and nearly aligned with the hidden fastener.
Figure 7A:
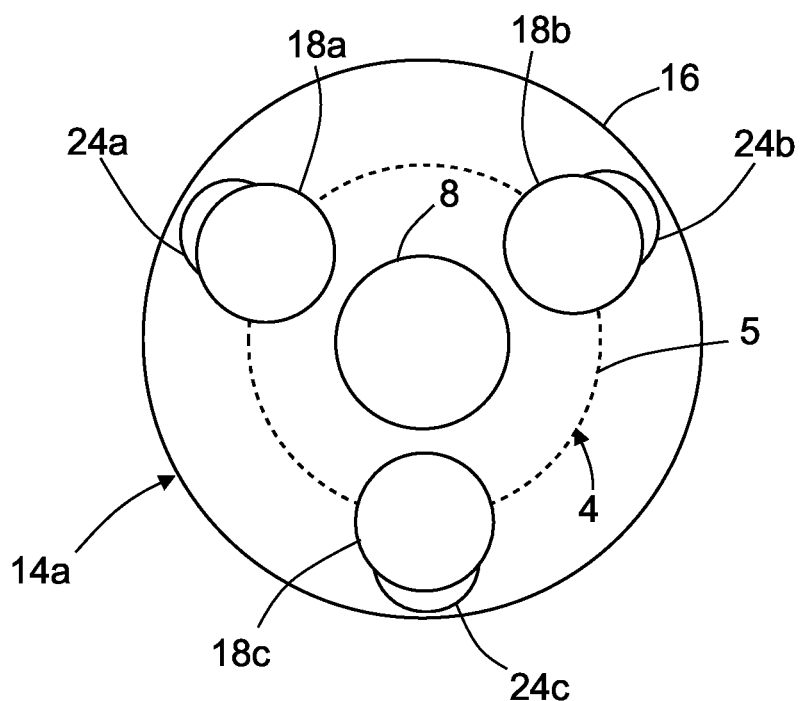
FIG. 7A is a diagram showing a top view of the multi-probe sensor head overlying and aligned with the hidden fastener.

FIGS. 5A, 6A, and 7A are diagrams showing respective top views of a multi-probe sensor head 14*a* at three different sensor head positions relative to the fastener 4. The dashed circle indicates the circular outer perimeter of the fastener head 5. The sensor head includes three probes 18*a*-18*c* having respective centers that are offset from a center of the multi-probe sensor head 14*a*. In accordance with one embodiment, the probe centers are offset by equal distances at respective angular positions in a frame of reference of the sensor head, which angular positions are separated by equi-angular intervals (e.g., 120 degrees). The multi-probe sensor head 14*a* further includes a plunger 8 at its center.

The offset positions of the centers of probes 18*a*-18*c* are adjustable along respective radial lines that extend from the center (axis of rotation) of the multi-probe sensor head 14*a*. This adjustability is enabled by providing radial probe adjustment slots 24*a*-24*c* and locking mechanisms for locking probes 18*a*-18*c* at respective positions along the lengths of radial probe adjustment slots 24*a*-24*c* respectively. During set-up, the radial positions of the centers of probes 18*a*-18*c* are adjusted so that the pitch circle intersecting the probe centers has a diameter that has a specified relationship to the outer diameter of the fastener head 5. For example, the probe radial positions may be selected such that the diameter of the pitch circle is equal to the outer diameter of the fastener head 5.

Figure 5B:
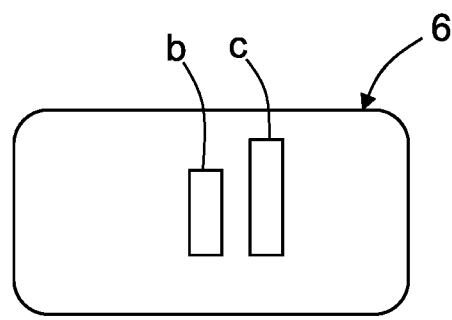
FIG. 5B is a diagram representing the display of a graph representing the amplitudes of respective electrical signals produced by two of the three probes in the scenario depicted in FIG. 5A.

FIG. 5B is a diagram representing the display on an oscilloscope 6 of a graph representing the magnitudes of respective electrical signals produced by the probes 18a-18c while the probes are positioned relative to the fastener 4 as depicted in FIG. 5A. In this scan position, the multi-probe sensor head 14a partially overlies and is not nearly aligned with the fastener 4. In the example scenario depicted in FIGS. 5A and 5B, the probe 18a does not produce an electrical signal due to interaction with the fastener 4 because probe 18a is outside the detection range, whereas probes 18b and 18c produce electrical signals having respective magnitudes which depend on the degree to which the multi-probe sensor head 14a is aligned with the fastener 4. Because the center of probe 18c is closer to the center of fastener 4 than is the center of probe 18b, the magnitude of the electrical signal c produced by probe 18c is greater than the magnitude of the electrical signal b produced by probe 18b.

Figure 6B:
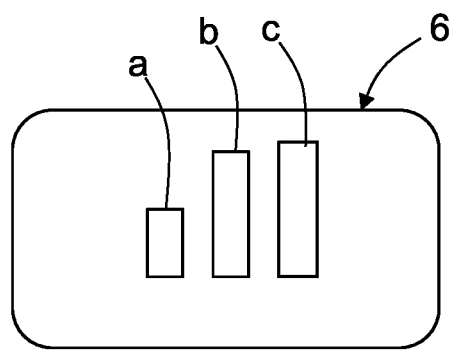
FIG. 6B is a diagram representing the display of a graph representing the amplitudes of respective electrical signals produced by the three probes in the scenario depicted in FIG. 6A.

FIG. 6B is a diagram representing the display on an oscilloscope 6 of a graph representing the magnitudes of respective electrical signals produced by the probes 18a-18c while the probes are positioned relative to the fastener 4 as depicted in FIG. 6A. In this scan position, the multi-probe sensor head 14a overlies and is nearly aligned with the fastener 4. In the example scenario depicted in FIGS. 6A and 6B, the probes 18a-18c again produce electrical signals having respective magnitudes which depend on the degree to which the multi-probe sensor head 14a is aligned with the fastener 4. Because the center of probe 18b is closer to the center of fastener 4 than is the center of probe 18a, the magnitude of the electrical signal b produced by probe 18b is greater than the magnitude of the electrical signal a produced by probe 18a. Similarly, because the center of probe 18c is slightly closer to the center of fastener 4 than is the center of probe 18b, the magnitude of the electrical signal c produced by probe 18c is slightly greater than the magnitude of the electrical signal b produced by probe 18b.

Figure 7B:
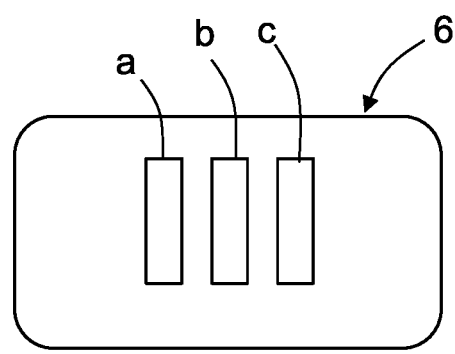
FIG. 7B is a diagram representing the display of a graph representing the amplitudes of respective electrical signals produced by the three probes in the scenario depicted in FIG. 7A.

FIG. 7B is a diagram representing the display on an oscilloscope 6 of a graph representing the magnitudes of respective electrical signals produced by the probes 18a-18c while the probes are positioned relative to the fastener 4 as depicted in FIG. 7A. In this scan position, the multi-probe sensor head 14a overlies and is aligned with the fastener 4. In the example scenario depicted in FIGS. 7A and 7B, the probes 18a-18c produce electrical signals having equal magnitudes because the centers of probes 18a-18c are equidistant from the center of fastener 4. This balance in the probe output signals indicates that the center of the multi-probe sensor head 14a is aligned with the center of the fastener 4.

The multi-probe sensor head 14a may be moved intermittently over the skin of an aircraft fuselage to successive sensor head positions in the vicinity of a fastener to be located. At each successive sensor head position, the probes 18a-18c generate respective sensor data signals which vary in dependence on the position of the respective probe relative to the fastener 4. The fastener location is found (determined) when the probe output signals are balanced at a particular tool location.

Figure 8A:
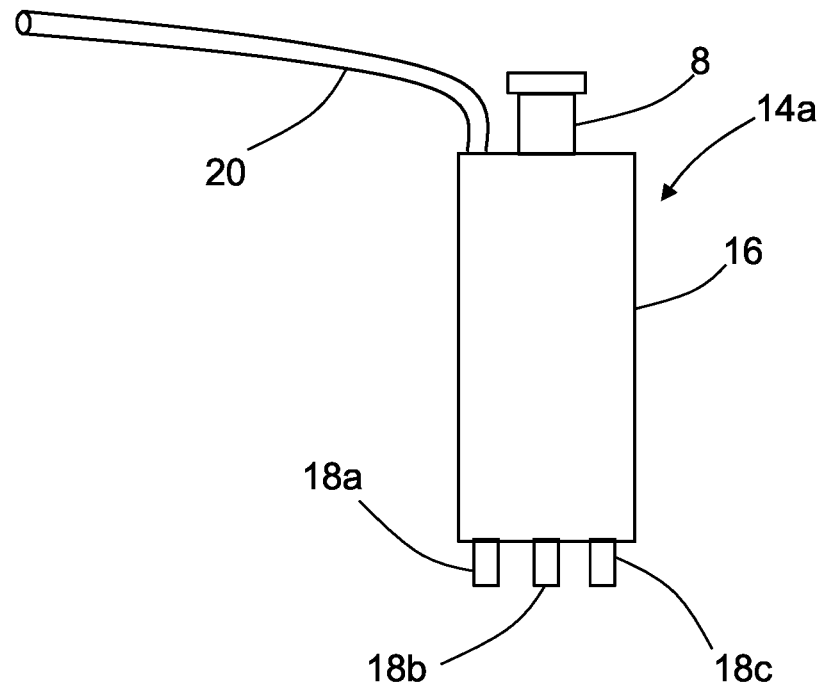
FIG. 8A is a diagram representing a side view of a sensor head having three probes surrounding a plunger-mounted marking device in accordance with one embodiment.

In accordance with the embodiments depicted in FIGS. 2A and 5A, the fastener locating tool 10 incorporates a plunger 8 and a marking device (not visible in FIGS. 2A and 5A) attached to a distal end of the plunger 8. The marking device would be used to mark the fastener location on the coated surface. FIG. 8A is a diagram representing a side view of a multi-probe sensor head 14a having three probes 18a-18c surrounding the plunger 8.

Figure 8B:
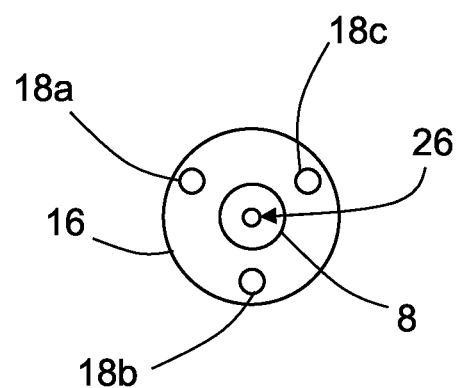
FIG. 8B is a diagram representing a bottom view of the sensor head depicted in FIG. 8A.

FIG. 8B is a diagram representing a bottom view of the multi-probe sensor head 14a depicted in FIG. 8A. As seen in FIG. 8B, the marking device 26 is disposed along the center axis of the base 16 of multi-probe sensor head 14a. In the case of an entirely manual fastener locating process, the tool user can mark the coating 2 at a position overlying the center of the fastener 4 by depressing the plunger 8 by hand, thereby causing the plunger 8 to displace from a retracted position to an extended position at which the marking device 26 contacts and marks the coating 2. The plunger 8 is spring-loaded so that a spring force restores the plunger 8 to its retracted position when the tool user releases the plunger 8. After the location of the center of fastener 4 has been marked on the coating 2, the entire fastener locating tool 10 (with marking device 26) is removed. After the fastener locating tool 10 has been removed, the portion of the coating 2 overlying the fastener 4 is cut along a circular line having a diameter equal to the outer diameter of the head 5 using a cutting tool (not shown in the drawings).

Figure 9A:
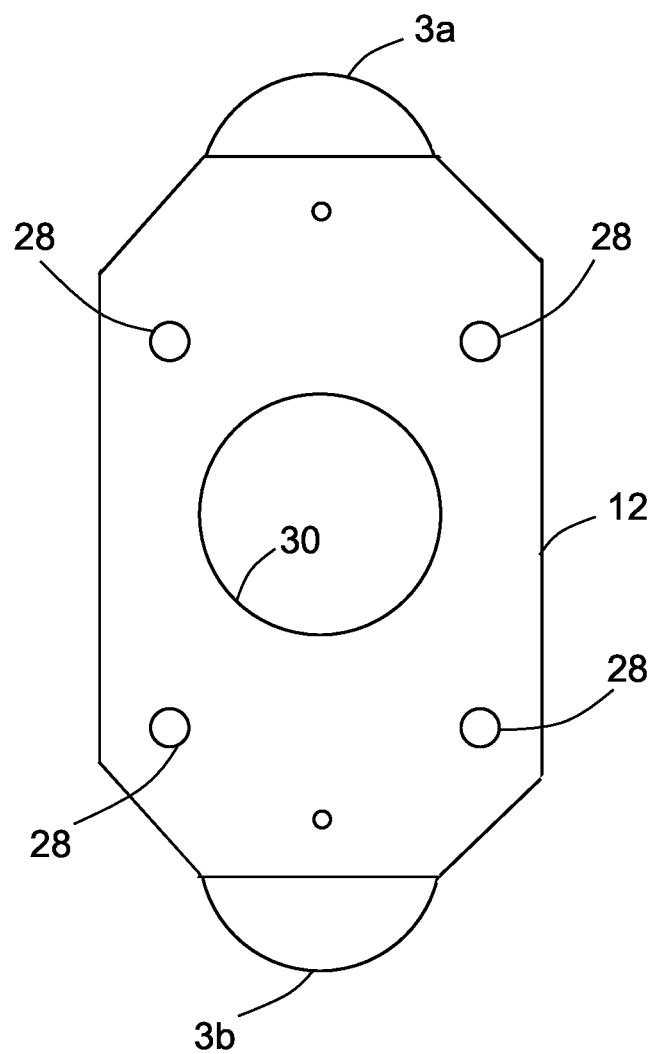
FIG. 9A is a diagram representing a top view of a platform having a central clearance hole and equipped with two vacuum adherence devices in accordance with one embodiment.
Figure 9B:
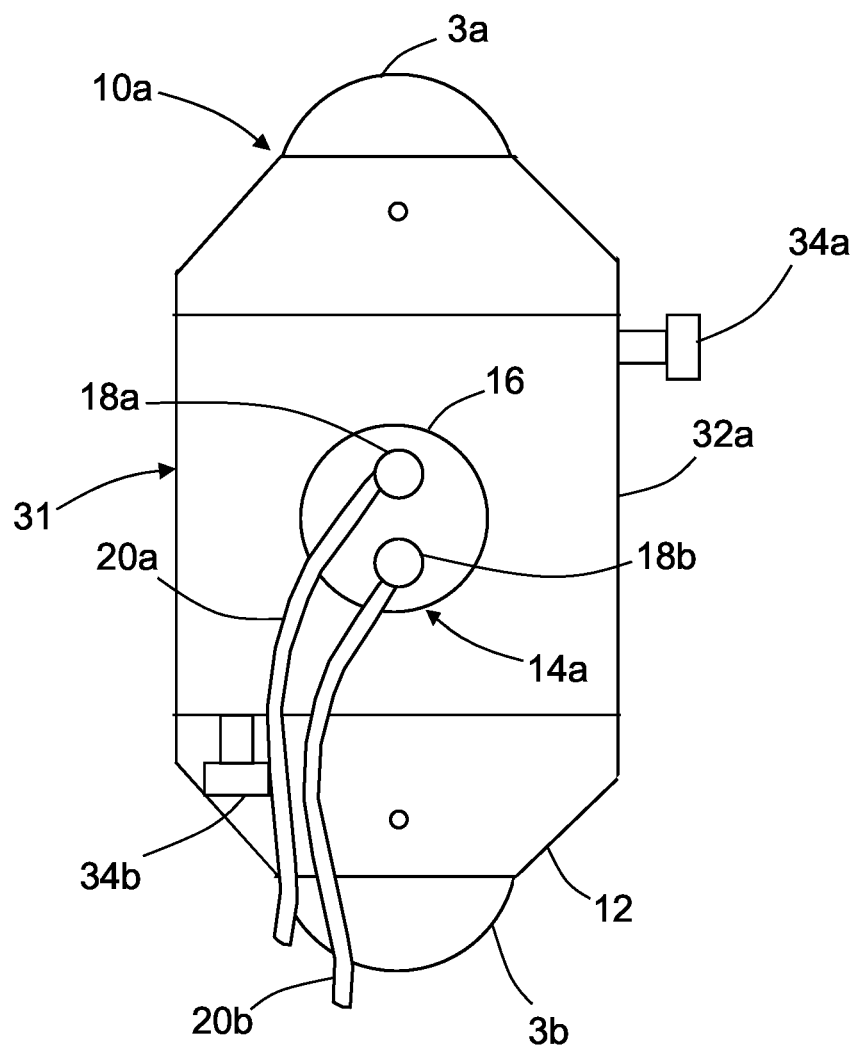
FIG. 9B is a diagram representing a top view of a fastener locating tool that includes a sensor head with two probes mounted to a manually operable multi-stage positioning system, which is in turn mounted to the platform depicted in FIG. 9A.
Figure 9C:
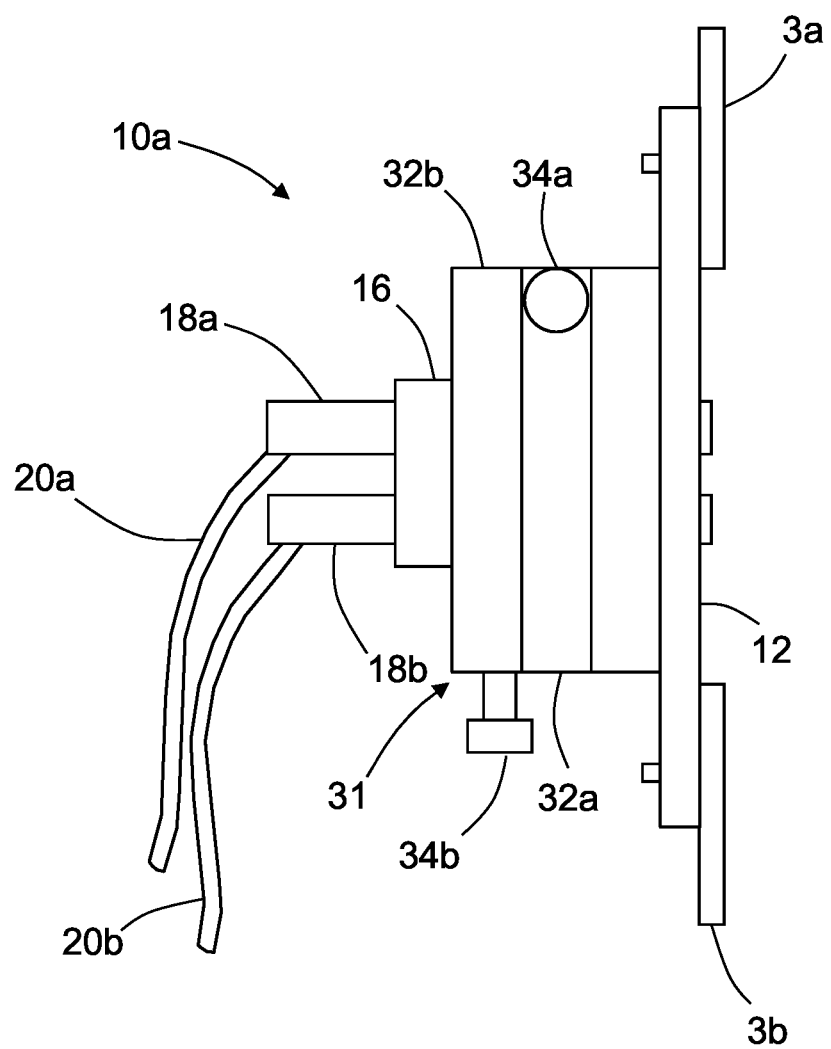
FIG. 9C is a diagram representing a side view of the fastener locating tool depicted in FIG. 9B.

In accordance with one embodiment depicted in FIGS. 9B and 9C, the multi-probe tool embodiment includes a multi-stage positioning system 31 having an X stage 32a and a Y stage 32b to make small, finer adjustments after the initial positioning by hand. More specifically, the fastener locating tool 10a includes a multi-probe sensor head 14a mounted to the multi-stage positioning system 31, which is in turn mounted to the platform 12 depicted in FIG. 9A.

FIG. 9A shows a top view of a platform 12 having a central clearance hole 30 which provides clearance for the probes as the X and Y stages 32a and 32b are moved. The platform 12 is equipped with two attachment devices 3a and 3b at opposite ends of platform 12. FIG. 9B shows a top view of a fastener locating tool 10a after the multi-stage positioning system 31 has been mounted to the platform 12. In this example, the fastener locating tool 10a has two probes 18a and 18b which are offset from the center of the base 16 at diametrally opposed angular positions. The probes 18a and 18b are connected to a signal processor (not shown in FIG. 9B) by respective cables 20a and 2b. In the case wherein the attachment devices 3a and 3b are vacuum adherence devices, vacuum pressure may be supplied via respective vacuum tubes (not shown in FIG. 9B).

FIG. 9C shows a side view of the fastener locating tool 14a depicted in FIG. 9B. After the platform 12 has been adhered to the coated surface using attachment devices 3a and 3b, the multi-probe sensor head 14a may be rotated and sensor data acquired at a first sensor head position. Then the multi-probe sensor head 14a is moved to a second position, whereat the multi-probe sensor head 14a is rotated again. This sequence of incremental movement followed by rotation is repeated until the multi-probe sensor head 14a is at a precise location where the probe output signals balance. Fine adjustments to the position of the multi-probe sensor head 14a may be made using the multi-stage positioning system 31. The multi-stage positioning system 31 is manually operable by means of thumbscrews 34a and 34b (shown in FIGS. 9B and 9C). More specifically, the multi-probe sensor head 14a may be moved incrementally in the X direction by turning thumbscrew 34a and in the Y direction by turning thumbscrew 34b.

In alternative embodiments, the incremental movements of the X and Y stages 32a and 32b may be driven by respective motors. FIG. 10 is a block diagram identifying components of a fastener locating tool that includes an automated multi-stage positioning system that includes X stage 32a and Y stage 32b. The X stage 32a is driven to translate in the X direction by an X-stage motor 38a. The Y stage 32b is driven to translate in the Y direction by a Y-stage motor 38b. The base 16 of a sensor head 14 is driven to rotate by a sensor head rotation motor 38c.

The X-stage motor 38a, Y-stage motor 38b, and sensor head rotation motor 38c are controlled by respective motor controllers 36a-36c (a.k.a. electronic speed control circuits). The motor controllers 36a-36c control the speed and direction of rotation of the motors based on control signals received from a system controller 42. The system controller 39 is a computer configured to send control signals to the motor controllers 36a-36c in accordance with a search routine that moves the sensor head 14 to successive sensor head positions. At each sensor head position, the sensor head is rotated while maintaining the X and Y stages 32a and 32b stationary, thereby causing the probe 18 to revolve. During each revolution of the probe, the signal processor 40 conditions and processes the electrical signals output by the probe 18. The electrical signals are output to a display device 56 for presentation on a display screen. The results of the signal processing are output to the system controller 42. In particular, the signal processor 40 is configured (programmed or hard-wired) to output an end search signal to the system controller 42 when the variation in the magnitude of the electrical signal output by probe 18 during a single revolution is less than a specified threshold.

When the fastener has been located, the platform may be adhered to the coated surface, the sensor head 14 may be removed, and a cutter guide (not shown in the drawings) may be installed in its place. A rotating cutter of appropriate size is then lowered through the cutter guide, thereby transforming the fastener locating tool into a coating cutting tool. The cutter may be mounted to the bit of a hand-held motorized drill which drives rotation of the cutter. When the drill motor is turned on, the coating 2 is removed exactly over the hidden fastener head 5. The depth of the cut could be set using a shoulder on the cutter guide that matches a shoulder on the cutter. A Z stage, which moves perpendicular to the X-Y plane, may be added to the X and Y stages for this aspect of cutter depth to avoid damage to the fastener head or coating cutter.

Figure 11:
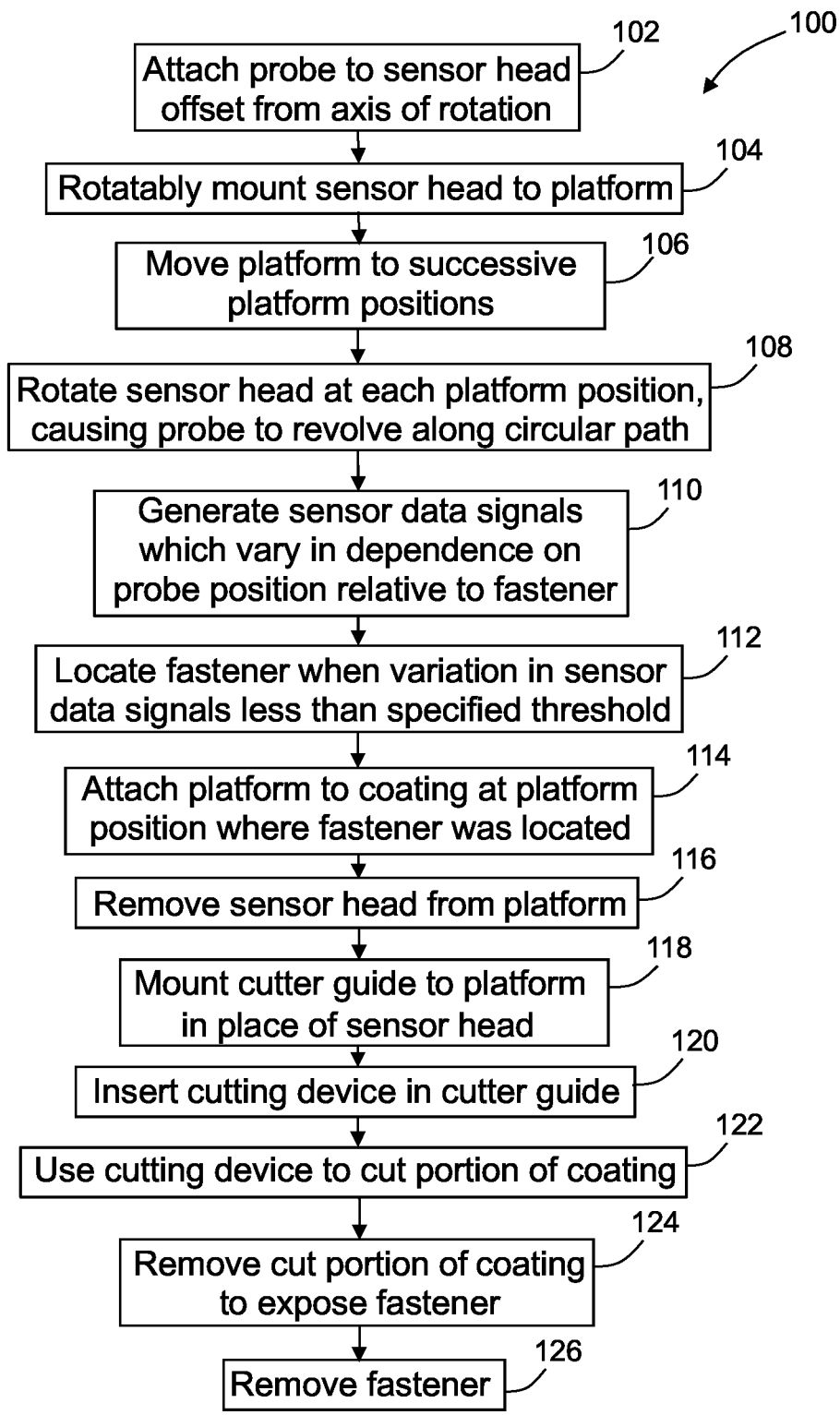
FIG. 11 is a flowchart identifying steps of a method for locating a fastener under a coating in accordance with one embodiment.

FIG. 11 is a flowchart identifying steps of a method 100 for locating a fastener 4 under a coating 2 using the fastener locating tool 10 depicted in FIG. 1. First, the probe 18 is attached to the sensor head 14 such that the probe 18 is offset from an axis of rotation of the sensor head 14 (step 102). The sensor head 14 is rotatably mounted to the platform 12 (step 104). Then the platform 12 is moved to successive platform positions overlying the coating 2 (step 106). The sensor head 14 is rotated about the axis of rotation at each successive platform position, thereby causing the probe 18 to revolve along a circular path (step 108). During each revolution, the probe 18 is used to generate sensor data signals which vary in dependence on a position of the probe 18 relative to the fastener 4 (step 110). The fastener 4 is located when variation in the sensor data signals is less than a specified threshold (step 112). The platform 12 is adhered to the coating 2 at a platform position where the fastener 4 was located (step 114). Then the sensor head is removed from the platform (step 116). Then a cutter guide is mounted to the platform 12 in place of the sensor head 14 (step 118). A cutting device is then inserted inside the cutter guide (step 120). The cutting device is activated to cut a portion of the coating 2 (step 122). The cut portion of the coating is removed to expose the fastener 4. Then the fastener 4 is removed.

In accordance with various automated embodiments, the fastener locating tool 10 (comprising a sensor head 14 rotatably mounted to a platform 12 as shown in FIG. 1) could be mounted to a robot. The robot may operate automatically under the control of a system controller which is configured to execute a search routine. The system controller may be a computer programmed to place the center of the sensor head 14 at respective line intersections in a virtual grid. This fully automated method is capable of quickly and precisely locating an entire pattern of fasteners that could be addressed immediately one at a time or marked for later coating removal.

Figure 12:
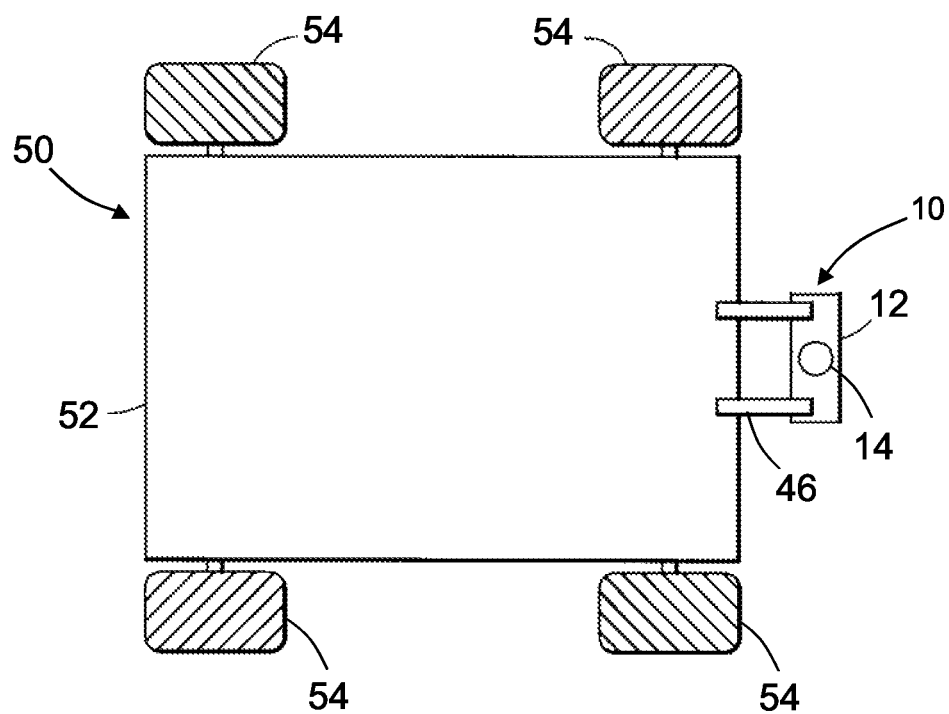
FIG. 12 is a diagram representing a side view of an automated system comprising a fastener locating tool mounted to a crawling robot (motors and gears are not shown).

FIG. 12 is a diagram representing a side view of an automated system comprising a fastener locating tool 10 mounted to a crawling robot 50 (motors and gears are not shown). The crawling robot 50 includes a frame 52, four wheels 54 rotatably coupled to the frame 52, and a Z-stage positioning system 46 translatably coupled to the frame 52. The four wheels 54 are independently driven to rotate by respective wheel motors (not shown in FIG. 12, but see wheel motors 38d in FIG. 13) mounted to the frame 52. The fastener locating tool 10 includes a sensor head 14 rotatably mounted to a platform 12. The platform 12 is mounted to the Z-stage positioning system. The platform 12 may be raised or lowered by operation of a Z-stage motor (not shown in FIG. 12, but see Z-stage motor 38e in FIG. 13).

Figure 13:
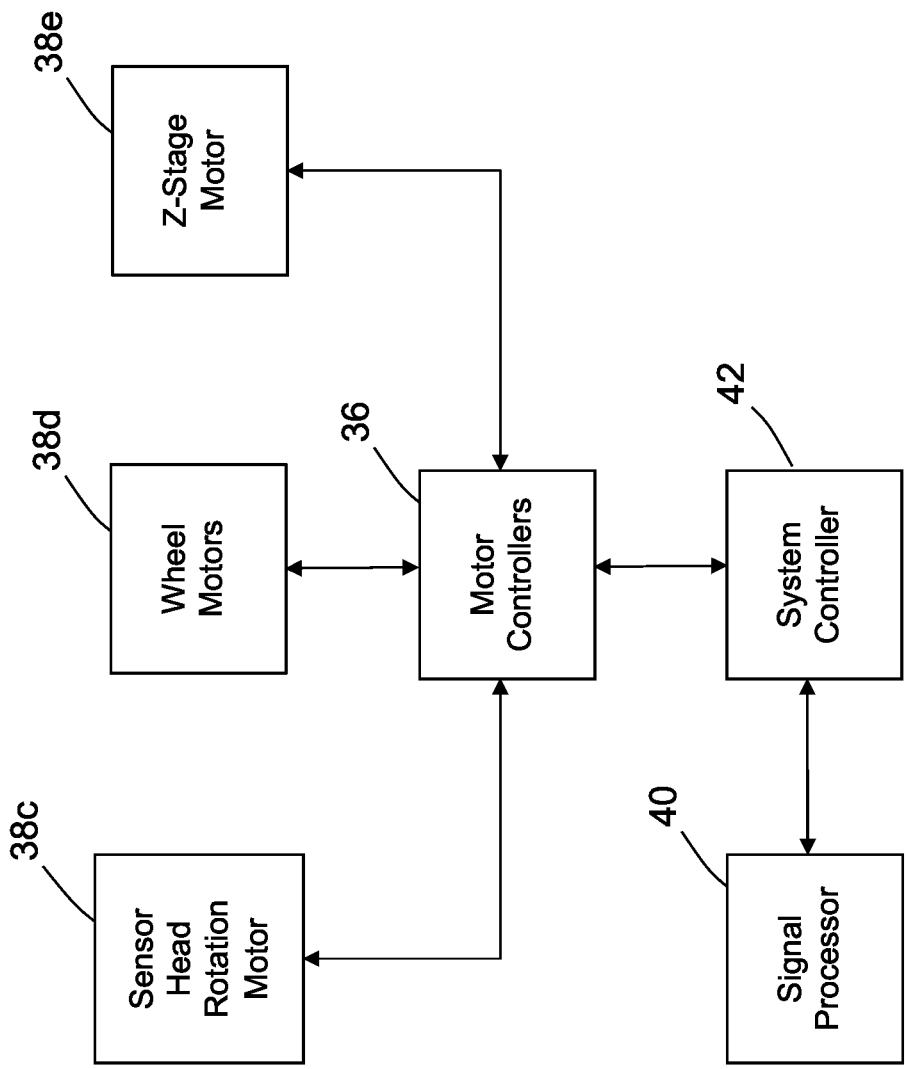
FIG. 13 is a block diagram identifying components of the automated system partly depicted in FIG. 12.

FIG. 13 is a block diagram identifying components of the automated system partly depicted in FIG. 12. The system controller 42 sends commands to respective motor controllers which control the operation of a sensor head rotation motor 38c, four wheel motors 38d, and the Z-stage motor 38e. The system controller 42 may be configured to control movements (rotation and displacement) of the sensor head 14 relative to a coated surface based on software instructions stored in a non-transitory tangible computer-readable storage medium or in response to commands received via wire or wirelessly from a workstation. The system controller 42 may be further configured to cease movement of sensor head 14 when the signal processor outputs a signal indicating that the center of the sensor head 14 is aligned with the center of a fastener.

In one proposed implementation, the crawling robot 50 may be a holonomic-motion crawler vehicle, in which case the wheels 54 may be Mecanum wheels. A holonomic motion system is one that is not subject to motion constraints. This type of system can translate in any direction while simultaneously rotating or rotate without translation. The Mecanum wheels may be driven to rotate by independently controlled stepper motors. Each Mecanum wheel has a multiplicity of tapered rollers rotatably mounted to its circumference, each roller being freely rotatable about its axis. These rollers typically have an axis of rotation which lies at a 45° angle with respect to the plane of the wheel.

The Z-stage positioning system 46 may be translatably coupled to frame 52 by means of a linear-motion bearing. The Z-stage positioning system 46 may be mechanically coupled to Z-stage motor 38e by any suitable drive mechanism known in the art. For example, the Z stage could have an attached nut which threadably engages a lead screw which is driven to rotate by the Z-stage motor 38e, thereby converting the rotation of the motor output shaft into translation of the Z stage.

While tools and methods for precisely locating a fastener under a coating have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

The method claims set forth hereinafter should not be construed to require that the steps recited therein be performed in alphabetical order (any alphabetical ordering in the claims is used solely for the purpose of referencing previously recited steps) or in the order in which they are recited. Nor should they be construed to exclude any portions of two or more steps being performed concurrently or alternatingly. For example, translation of two or more stages may occur concurrently or sequentially or may partially overlap in time.

As used in the claims, the term "sensor head position" means the position of the center of the sensor head and does not include the angular position of the offset probe(s). The structure corresponding to the means "sensor head support structure" recited in the claims includes one or more of the following: a platform with a multi-stage positioning system mounted thereto, a platform without a multi-stage positioning system, and structural equivalents thereof.

As used in the claims, the term "controller" should be construed broadly to encompass a system having at least one computer or processor, and which may have multiple computers or processors that communicate through a network or bus. As used in the preceding sentence, the terms "computer" and "processor" both refer to devices having a processing unit (e.g., a central processing unit) and some form of memory (i.e., computer-readable medium) for storing a program which is readable by the processing unit. For example, the term "controller" includes, but is not limited to, a small computer on an integrated circuit containing a processor core, memory and programmable input/output peripherals.

The methods described herein may be encoded as executable instructions embodied in a non-transitory tangible computer-readable storage medium, including, without limitation, a storage device and/or a memory device. Such instructions, when executed by a computer or processor, cause the computer or processor to perform at least a portion of the methods described herein.

The invention claimed is:

1. A method for locating a fastener under a coating, the method comprising:
   attaching a probe to a sensor head such that the probe is offset from an axis of rotation of the sensor head;
   mounting the sensor head to a robotic platform;
   moving the sensor head to successive sensor head positions overlying the coating;
   rotating the sensor head about the axis of rotation at each successive sensor head position, thereby causing the probe to revolve along a circular path;
   during each revolution, using the probe to generate sensor data signals which vary in dependence on a position of the probe relative to the fastener; and
   locating the fastener when variation in the sensor data signals is less than a specified threshold.

2. The method as recited in claim 1, further comprising marking the coating at a position overlying the fastener that was located.

3. The method as recited in claim 1, wherein the sensor head is rotatably mounted to the robotic platform, and wherein moving the sensor head to successive sensor head positions comprises moving the robotic platform to successive platform positions.

4. The method as recited in claim 3, further comprising:
   attaching the robotic platform to the coating at a platform position where the fastener was found;
   removing the sensor head from the robotic platform;
   mounting a cutter guide to the robotic platform in place of the sensor head;
   inserting a cutting device inside the cutter guide;
   activating the cutting device to cut a portion of the coating; and
   removing a cut portion of the coating to expose the fastener.

5. The method as recited in claim 1, wherein a diameter of the circular path of the probe during a revolution is equal to an outer diameter of a head of the fastener.

6. The method as recited in claim 1, wherein mounting the sensor head to the robotic platform comprises:
   rotatably mounting the sensor head to a multi-stage positioning system; and
   mounting the multi-stage positioning system to the robotic platform;
   wherein moving the sensor head comprises moving at least one stage of the multi-stage positioning system relative to the robotic platform.

7. A method for locating a fastener under a coating, the method comprising:
   attaching at least three probes to a sensor head such that respective centers of the probes are offset from a center of the sensor head by equal distances at respective angular positions in a frame of reference of the sensor head;
   mounting the sensor head to a robotic platform;
   moving the sensor head to successive sensor head positions overlying the coating;
   at each successive sensor head position, using the probes to generate respective sensor data signals which vary in dependence on a position of the respective probe relative to the fastener; and
   locating the fastener when the respective sensor data signals generated by the probes are in balance.

8. The method as recited in claim 7, further comprising marking the coating at a position overlying the fastener that was located.

9. The method as recited in claim 7, wherein the sensor head is rotatably mounted to the robotic platform, and wherein moving the sensor head to the successive sensor head positions comprises moving the robotic platform to successive platform positions.

10. The method as recited in claim 9, further comprising:
    attaching the robotic platform to the coating at a platform position where the fastener was found;
    removing the sensor head from the robotic platform;
    mounting a cutter guide to the robotic platform in place of the sensor head;
    inserting a cutting device inside the cutter guide;
    activating the cutting device to cut a portion of the coating; and
    removing a cut portion of the coating to expose the fastener.

11. The method as recited in claim 7, wherein the centers of the probes lie along a pitch circle having a diameter equal to a diameter of a head of the fastener.

12. The method as recited in claim 7, wherein mounting the sensor head to the robotic platform comprises:

mounting the sensor head to a multi-stage positioning system; and mounting the multi-stage positioning system to the robotic platform;

wherein moving the sensor head comprises moving at least one stage of the multi-stage positioning system relative to the robotic platform.

13. The method as recited in claim 12, wherein moving at least one stage of the multi-stage positioning system relative to the robotic platform comprises activating a motor to drive rotation of a lead screw.

14. A tool for locating a fastener under a coating, the tool comprising:

a platform having a circular opening;

a bushing seated in the circular opening in the platform and having a circular cylindrical bore;

a sensor head comprising a base having a circular cylindrical body portion which is disposed inside and rotatable relative to the circular cylindrical bore of the bushing and a probe that is offset from a center of the base and configured to detect a fastener under the coating when the sensor head overlies the coating, wherein the probe revolves along a circular path as the sensor head rotates inside the bushing.

15. The tool as recited in claim 14, further comprising a motor coupled to drive rotation of the sensor head about an axis of rotation at the center of the base.

16. The tool as recited in claim 14, wherein the sensor head further comprises a marking device mounted to the center of the base.

17. A tool for locating a fastener under a coating, the tool comprising:

a sensor head support structure having a circular opening; and a sensor head comprising a base disposed in the circular opening and a first probe that is offset from a center of the base and configured to detect a fastener under the coating when the sensor head overlies the coating, wherein the sensor head further comprises second and third probes that are offset from the center of the base.

18. A tool for locating a fastener under a coating, the tool comprising:

a sensor head support structure having a circular opening; and a sensor head comprising a base disposed in the circular opening and a first probe that is offset from a center of the base and configured to detect a fastener under the coating when the sensor head overlies the coating, wherein the sensor head further comprises a marking device mounted to the center of the base.

19. A tool for locating a fastener under a coating, the tool comprising:

a sensor head support structure having a circular opening; and a sensor head comprising a base disposed in the circular opening and a first probe that is offset from a center of the base and configured to detect a fastener under the coating when the sensor head overlies the coating, wherein the sensor head support structure comprises:

a platform; and a multi-stage positioning system mounted to the platform and comprising a stage having the circular opening.

20. The tool as recited in claim 19, further comprising a motor mounted to the multi-stage positioning system and coupled to drive rotation of the sensor head about an axis of rotation at the center of the base.

21. An automated system for locating a fastener under a coating, the system comprising:

a robot;

a platform mounted to the robot and having a circular opening;

a sensor head comprising a base disposed in the circular opening and at least one probe that is offset from a center of the base and configured to detect a fastener under the coating when the probe is within a detection range of the fastener; and a motor coupled to drive rotation of the sensor head about an axis of rotation at the center of the base.

* * * * *